United States Patent [19]

Suzuki

[11] Patent Number: 4,947,074
[45] Date of Patent: Aug. 7, 1990

[54] PIEZOELECTRIC ELEMENT DRIVE CIRCUIT

[75] Inventor: Masashi Suzuki, Nagoya, Japan

[73] Assignee: Brother Kogyo Kabushiki Kaisha, Aichi, Japan

[21] Appl. No.: 443,091

[22] Filed: Nov. 27, 1989

Related U.S. Application Data

[63] Continuation of Ser. No. 120,400, Nov. 13, 1987, abandoned.

[30] Foreign Application Priority Data

Nov. 15, 1986 [JP] Japan .................... 61-272335
Nov. 20, 1986 [JP] Japan .................... 61-277946

[51] Int. Cl.⁵ .................................. H01L 41/08
[52] U.S. Cl. .................................. 310/316; 310/317
[58] Field of Search .................... 310/316, 317, 319; 318/116, 118; 348/75, 140 R

[56] References Cited

U.S. PATENT DOCUMENTS

| | | | |
|---|---|---|---|
| 4,109,174 | 8/1978 | Hodgson | 310/316 |
| 4,353,004 | 10/1982 | Kleinschmidt | 310/317 X |
| 4,498,089 | 2/1985 | Scardovi | 310/317 X |
| 4,595,854 | 6/1986 | Yano | 310/317 |
| 4,644,212 | 2/1987 | Moritugu et al. | 310/317 |
| 4,688,536 | 8/1987 | Mitsuyasu | 310/318 X |
| 4,705,003 | 11/1987 | Sakakibara et al. | 310/317 X |
| 4,732,129 | 3/1988 | Takigawa et al. | 310/316 X |
| 4,743,789 | 5/1988 | Puskas | 310/317 X |
| 4,749,897 | 6/1988 | Natsume et al. | 310/328 X |
| 4,767,959 | 8/1988 | Sakakibara et al. | 310/317 |

FOREIGN PATENT DOCUMENTS 2156609 2/1985 United Kingdom .

*Primary Examiner*—Mark O. Budd
*Attorney, Agent, or Firm*—Kane, Dalsimer, Sullivan, Kurucz, Levy, Eisele and Richard

[57] ABSTRACT

Disclosed is a piezoelectric element drive circuit which comprises a charge circuit for charging the piezoelectric element in response to an external signal, and a switching circuit connected between the terminals of the piezoelectric element via reactor means to allow a current flow in one direction selected in response to an external signal for transferring the charges supplied from the charge circuit and stored in the piezoelectric element from its high-potential side to its low-potential side whereby the piezoelectric element is charged to be in the opposite polarity.

Optionally, the power stored in the piezoelectric element is regenerated at the power source instead of charging the piezoelectric element in the opposite polarity.

With the above drive circuit, the power once supplied to the piezoelectric element from the power source is cyclically used for improved power efficiency.

13 Claims, 9 Drawing Sheets

PIEZOELECTRIC ELEMENT DRIVE CIRCUIT

This is a continuation of prior complete application Ser. No. 120,400, filed on Nov. 13, 1987 now abandoned.

BACKGROUND OF THE INVENTION

This invention relates to a piezoelectric element device circuit with a improved power efficiency.

The use of piezoelectric elements has been proposed to drive wires in a matrix printer or an ink particle generating system in an inlet printer. Such a piezoelectric element is driven by an exemplary drive circuit as shown in FIG. 7. The piezoelectric element 2 shown is to be connected to a direct-current power source 1 via a transistor 3 so that it receives voltage from the source 1 when the transistor 3 is turned on by a print start signal S1. The element 2 expands or contracts with the voltage applied thereto. This displacement is then magnified by a transfer unit to drive a wire as in a printing mechanism. Because the piezoelectric element 2 serves as a capacitor, the charged element 2 is kept expanded or contracted if the transistor 3 is turned off, so that the print mechanism is not allowed to restore its original position. This problem is solved by providing a transistor 4 connected in parallel with the piezoelectric element 2 via a resistor 10, which is kept on for a certain length of time in response to a print end signal S2 after print is completed. This allows the piezoelectric element 2 to discharge to turn the voltage to zero whereby the print mechanism is allowed to restore its original position.

In this arrangement, the charge stored within the piezoelectric element 2 is lost as resistance loss so that the element 2 must be re supplied with power from the direct-current power source 1 to be driven again. This entails a significant power loss and therefore a reduced power efficiency during driving the printing mechanism.

SUMMARY OF THE INVENTION

It is therefore an object of the invention to provide an improved piezoelectric element drive circuit capable of recycling the charge stored in the piezoelectric element to improve the power efficiency.

In one aspect of the invention, the charge accumulated in the piezoelectric element is cyclically transferred from its high potential side to its low potential side. In this aspect, there is provided a piezoelectric element drive circuit which comprises:

a charge circuit for charging the piezoelectric element in response to an external signal; and a switching circuit connected between the terminals of said piezoelectric element via reactor means to allow a current flow in one direction selected in response to an external signal for transferring the charge supplied from said charge circuit and stored in said piezoelectric element from its high-potential side to its low-potential side whereby said piezoelectric element is charged to be in the opposite polarity.

With the above constructed drive circuit, when the switching circuit is turned on to allow the current flow in the corresponding direction in response to the external control signal, the positive charge stored in one terminal of the piezoelectric element is passed through a reactor means and the switching circuit t the other terminal of the piezoelectric element. The current which take form of resonance waveform is interrupted at half a cycle of resonance because the switching circuit allows the current flow only in one direction. The piezoelectric element is thus charged to provide a reverse polarity. When another control signal is applied t the switching circuit, the latter allows the current flow only in the direction opposite to above. The positive charge stored in the piezoelectric element is transferred to the other electrode at half a cycle of resonance to charge the piezoelectric element to a reverse polarity.

The piezoelectric element is thus charged to alternate between opposite polarities for alternate expansion and contraction thereof. Assuming for instance that the piezoelectric element charged to one polarity provides an operating condition in which a corresponding dot printer wire is in an impact-applying position and that the piezoelectric element charged to the other polarity provides a non-operating condition in which the wire is in its original position, the two conditions alternate by controlling the switching circuit in response to a control signal. Therefore, the charge once stored in the piezoelectric element from the power source is reserved in the piezoelectric element with the polarity of non-operating condition and is re-used in the operating condition for driving wires or the like. The power loss incurred for reversing the charge polarity of the piezoelectric element is compensated for by a voltage supplied from the power source in the non-operating condition or just after the operating condition is terminated at the piezoelectric element.

Consequently, the power once stored in the piezoelectric element from the power source is fully used for improved power efficiency in the piezoelectric element drive circuit.

In another aspect of the invention, the charge accumulated in the piezoelectric element is regenerated at the power source instead of charging the piezoelectric element in the opposite polarity. In this aspect, the piezoelectric element drive circuit may comprise:

a direct-current power source;

power transmitting means interconnected between said power source and said piezoelectric element for bidirectionally transmitting a power therebetween; and control means for controlling said power transmitting means so as to charge and discharge said piezoelectric element or to regenerate the charge accumulated in said piezoelectric element at said power source.

With the above constructed drive circuit, the charge accumulated in the piezoelectric element during driving thereof is regenerated at the power source after the drive is completed, thereby minimizing power loss with an improved power efficiency of the piezoelectric element drive device.

DESCRIPTION OF THE ACCOMPANYING DRAWINGS

DESCRIPTION OF THE PREFERRED EMBODIMENTS

Figure 1:
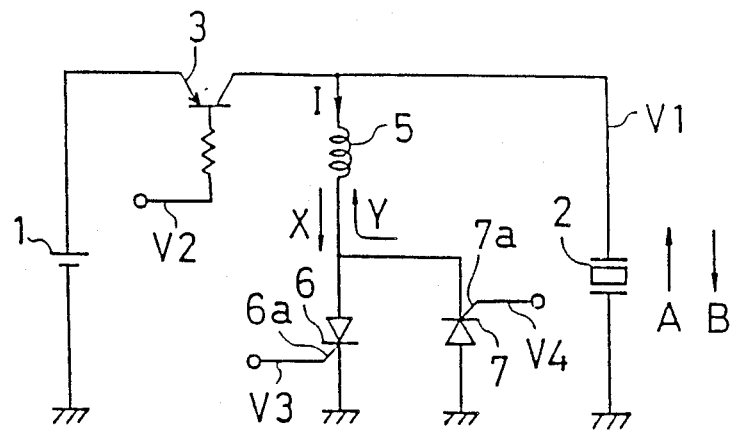
FIG. 1 is a circuit diagram of a piezoelectric element drive circuit embodying the invention.
Figure 7:
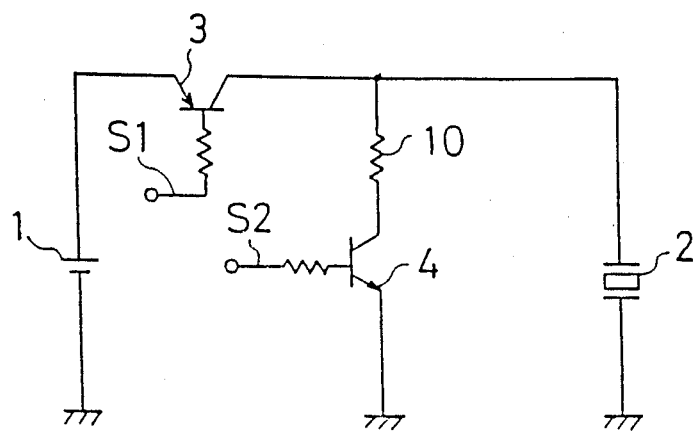
FIG. 7 is a circuit diagram of a prior art piezoelectric element drive circuit.

FIG. 1 shows a circuit diagram of a piezoelectric element drive circuit embodying the invention. To the terminals of the piezoelectric element 2 connected is a charge circuit consisting of a transistor 3 and a direct-current power source 1 in series connection with each other. Between the terminals of the piezoelectric element 2 connected is a series circuit consisting of a reactor 5 and a thyristor 6, with another thyristor 7 connected in parallel to the thyristor 6. These thyristors 6 and 7 in parallel connection form a switching circuit. With a forward voltage being applied thereto, the thyristors 6 and 7 are turned on when gate trigger voltages V3, V4 are applied to their gate 6a and gate 7a, respectively. The two thyristors 6 and 7 are connected so that the directions of electric currency therethrough become opposite each other.

Figure 2:
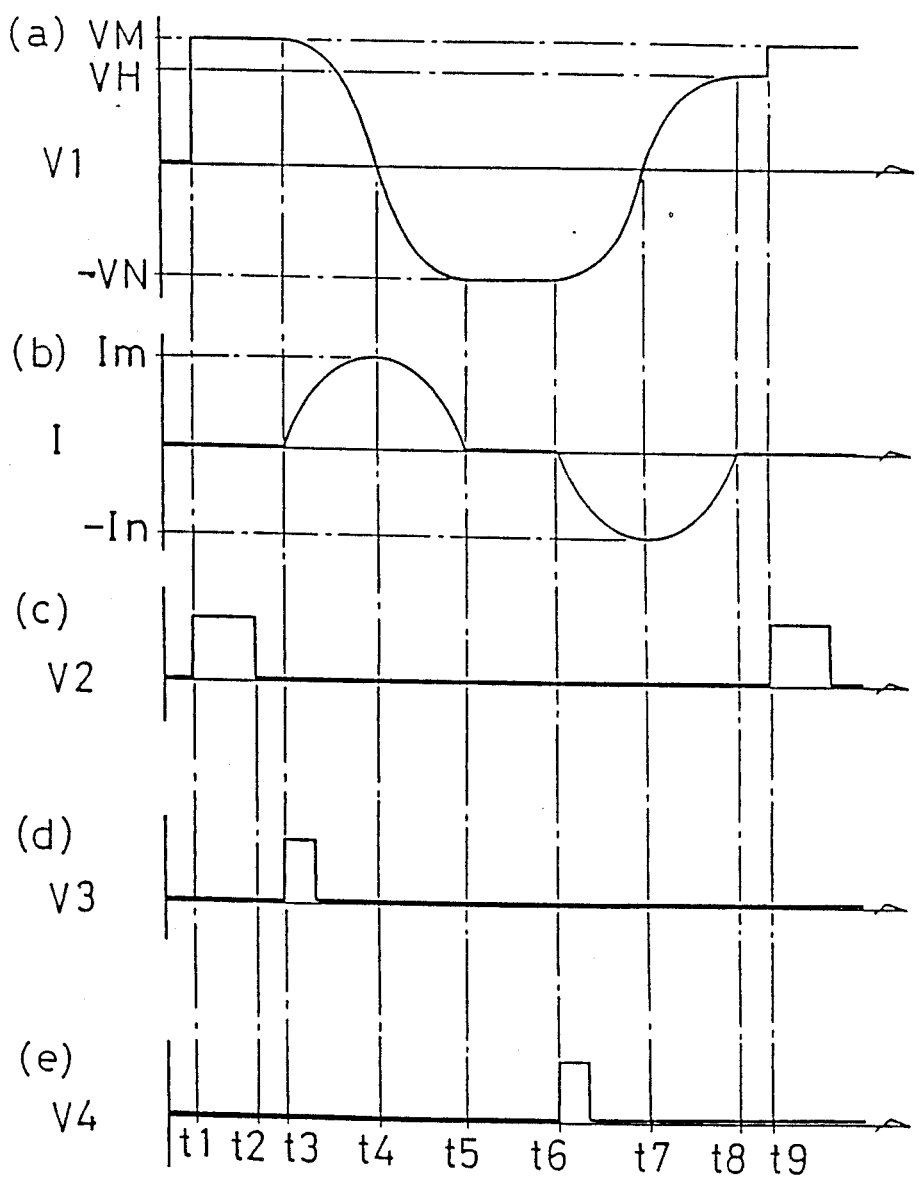
FIG. 2 is a timing chart for explanation of the operation of the drive circuit illustrated in FIG. 1.

FIG. 2 shows voltage and current waveforms at different parts of the drive circuit shown in FIG. 1. When the charge command signal V2 delivered to the base of the transistor 3 turns to high level at time tl, the transistor 3 is turned on to allow a voltage from the power source 1 to be applied to the piezoelectric element 2. The inter-terminal voltage V1 of the element 2 then turns to a predetermined supply voltage VM to charge the piezoelectric element 2 in A direction (referred to as "positive polarity" hereinbelow). The piezoelectric element 2 then expands or contracts so that the displacement developed due to positive charge (referred to as "positive displacement") is magnified by a transfer mechanism, not shown, to drive a wire, not shown, to cause a corresponding dot to be printed.

The charge command signal V2 delivered to the base of the transistor 3 turns to a low level at time t2 to turn off the transistor 3 at this time point. Meanwhile, the piezoelectric element 2 sustains charge to hold the inter-terminal voltage V1 at the supply voltage VM. The piezoelectric element 2 is thus kept displaced to hold the wire in its impact-applying position without restoring their original position.

When a positive pulse of the gate trigger voltage V3 is applied to the gate 6a of the thyristor 6 at time t3, the thyristor 6 is turned on. The charge retained in the piezoelectric element 2 with positive polarity is passed through the reactor 5 and the thyristor 6 in X direction to charge the piezoelectric element 2 in B direction (referred to as "reverse polarity" hereinbelow). The current I running through the reactor 5 lags by a $\pi/2$ phase behind the interterminal voltage V1 of the piezoelectric element 2. More specifically, the inter-terminal voltage V1 of the piezoelectric element 2 gradually drops from time t3 to time 4 and turns to zero at time t4, then to $-VN$ at time t5. On the other hand, the current I passing through the reactor 5 turns to the maximum value Im at time t4 and turns to zero at time t5. At time t5 when the current I passing through the reactor 5 turns to zero, the thyristor 6 is turned off with the inter-terminal voltage V1 held at $-VN$. This results in charging the piezoelectric element 2 with reverse polarity so that the displacement developed due to charge in reverse polarity (referred to as "negative displacement" hereinbelow) is magnified to return the wire displaced to the impact-applying position to their initial position. However, the inter-terminal voltage VN in reverse polarity is lower than the supply voltage VM because of loss due to charging the piezoelectric element 2 in reverse polarity.

When a positive pulse of the gate trigger voltage V4, which is a print command signal, is applied to the gate 7a of the thyristor 7 at time t6, the thyristor 7 is turned on. As a result, the charge accumulated in the piezoelectric element 2 in reverse polarity is passed through the reactor 5 and thyristor 7 in Y direction to charge the piezoelectric element 2 in positive polarity. The current I passing through the reactor 5 lags by phase of $\pi/2$ behind the interterminal voltage V1 of the piezoelectric element 2. More specifically, the inter-terminal voltage V1 of the piezoelectric element 2 gradually rises from time t6 to time t8 and turns to zero at time t7, then to VH at time t8. On the other hand, the current passing through the reactor 5 reaches at time t7 the maximum value of In in reverse direction and turns to zero at time t8. At the time t8 when the current I passing through the reactor 5 turns to zero, the thyristor 7 is turned off with the inter-terminal voltage V1 of the piezoelectric element 2 sustained at VH. This results in charging the piezoelectric element 2 in positive polarity to magnify the positive displacement whereby the wire is driven to execute printing. The charge voltage VH is lower than the voltage VN in reverse polarity and the supply voltage VM due to loss during charging.

Now, the transistor 3 is turned on by the charge command signal V2 at time t9, so that the piezoelectric element 2 receives additional supply voltage from the power source 1 for compensation for power loss. The inter-terminal voltage V1 of the piezoelectric element 2 then turns to the supply voltage VM.

Printing operation is accomplished by repeating the cycle as described above. The charge accumulated in the piezoelectric element 2 in positive polarity is thus sustained in the piezoelectric element 2 in reverse polarity in the non-operating condition by virtue of the resonance due to inductance of the reactor 5 and capacitance of the piezoelectric element 2. The charge accumulated in the element 2 in reverse polarity is used to charge the piezoelectric element 2 in positive polarity when running the subsequent cycle. The power source 1 has only to compensate for the power loss incurred due to the current flow around the reactor 5, the thyristor 6 and the thyristor 7 to drive wires with an improved power efficiency.

The above described embodiment is associated with a problem that the displacement during driving does not occur so smoothly because the piezoelectric element 2 is minutely displaced at time of t9 when charged from the power source 1. However, if the polarity of the piezoelectric element 2 is reversed, the relation between the polarity of the applied voltage and the direction of the displacement is opposite to that in the aforementioned case. The piezoelectric element 2 is thus in a non-operating condition when charged in A direction, while it is in an operating condition, i.e., in a printing condition when charged in B direction. Since additional supply from the power source 1 takes place to compensate for power loss in the non-operating condition, the displacement of the piezoelectric element 2 occurs smoothly during driving.

Figure 3:
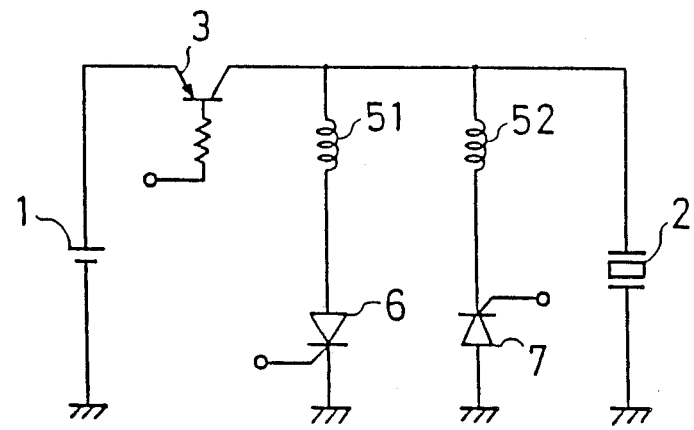
FIGS. 3, 4, 5 and 6 are circuit diagrams showing modified embodiments of the invention.

FIG. 3 is a circuit diagram of a modified piezoelectric element drive circuit. In this embodiment, the reactor 5 of the embodiment illustrated in FIG. 1 is divided into two reactor elements in parallel as illustrated in FIG. 3. To one reactor element 51 connected is the thyristor 6 and to the other 52 the thyristor 7. This arrangement allows separate control of the charging time when alternating the charge polarity of the piezoelectric element 2.

Figure 4:
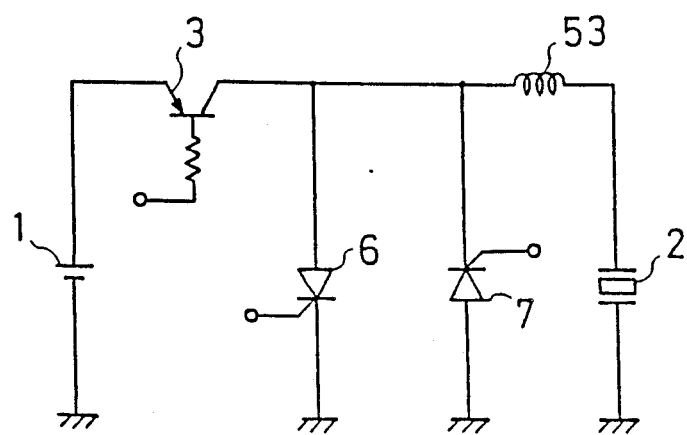

FIG. 4 shows a still further modification wherein the reactor 53 serves also as a coil to restrict a momentary current when supplying the piezoelectric element 2 with the charge from the power source 1.

Figure 5:
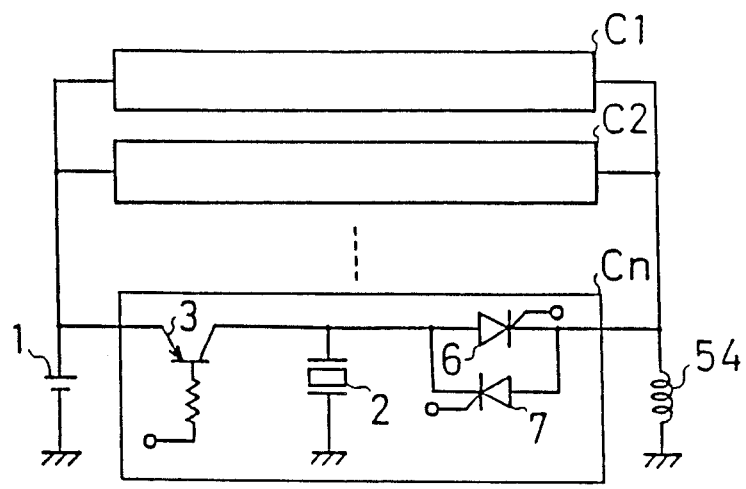
Figure 6:
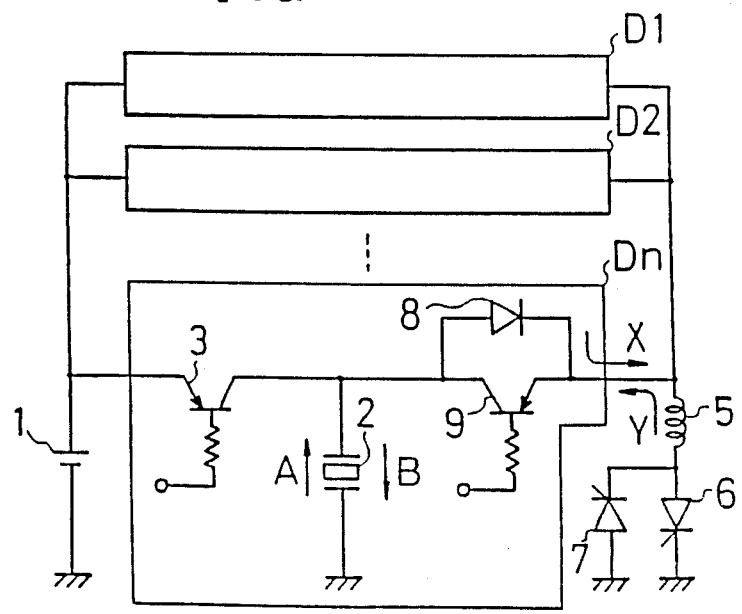

FIGS. 5 and 6 show a drive circuit installed in a matrix printer circuit. In the drive circuit of FIG. 5, the reactor 54 is shared by drive circuits Cl through Cn for the respective wires, not shown. In the drive circuit of FIG. 6, the reactor 5, the thyristor 6 and the thyristor 7 in FIG. 1 are shared by drive circuits Dl through Dn. Each drive circuit has connected between the reactor 5 and the piezoelectric element 2 with a parallel circuit consisting of a diode 8 allowing the current in X direction and a transistor 9 allowing the current in Y direction in response to a control signal. In this case, the piezoelectric element 2 is in its operating condition for causing wire impact when it is charged in A direction. After the impact is applied, the thyristor 6 is turned on so that only the charge accumulated in the piezoelectric elements 2 which have been charged in A direction among the drive circuits Dl through Dn is transferred to the cathodes of those piezoelectric elements 2 by way of the diode 8 and the shared reactor 5 and the thyristor 6 to charge them in B direction. When driving the element 2, only the transistor 9 of the driving circuit to drive a selected wire is turned on to turn on the thyristor 7. Then the charge accumulated in the piezoelectric element 2 in B direction to drive it is transferred to the same element 2 via the thyristor 7 and the reactor 7 shared by other circuits and further via the transistor 9 in the circuit to be driven so that the piezoelectric element 2 is charged in A direction. The transistor 3 of the circuit to be driven is then turned on to supply the piezoelectric element 2 with a voltage from the power source 1 to compensate for power loss. As a result, the wire, not shown, connected to the piezoelectric element 2 is driven to cause its dot to be printed. The piezoelectric element 2 charged in B direction may be assumed at an operating condition by changing the current direction of the diode 8 and the transistor 9 opposite to the case as shown. In this case, power loss compensation takes place in the non-operating condition of the element 2.

While the switching circuit is all composed of thyristors in the aforementioned embodiment, transistors may be instead adopted with turned on them at half a cycle of resonance.

The above embodiments comprise the switching circuit connected between both terminals of the piezoelectric element via a coil, which allows the current flow in one direction selected in response to the control signal to transfer the charge retained in the piezoelectric element from the high potential to low potential side thereby charging the piezoelectric element to a reverse polarity. Consequently, the charge stored in the piezoelectric element can be sustained in the piezoelectric element with its polarity reversed, whereby it can be re-used for driving the element in the succeeding cycle to improve the power efficiency of the driving circuit.

Figure 8:
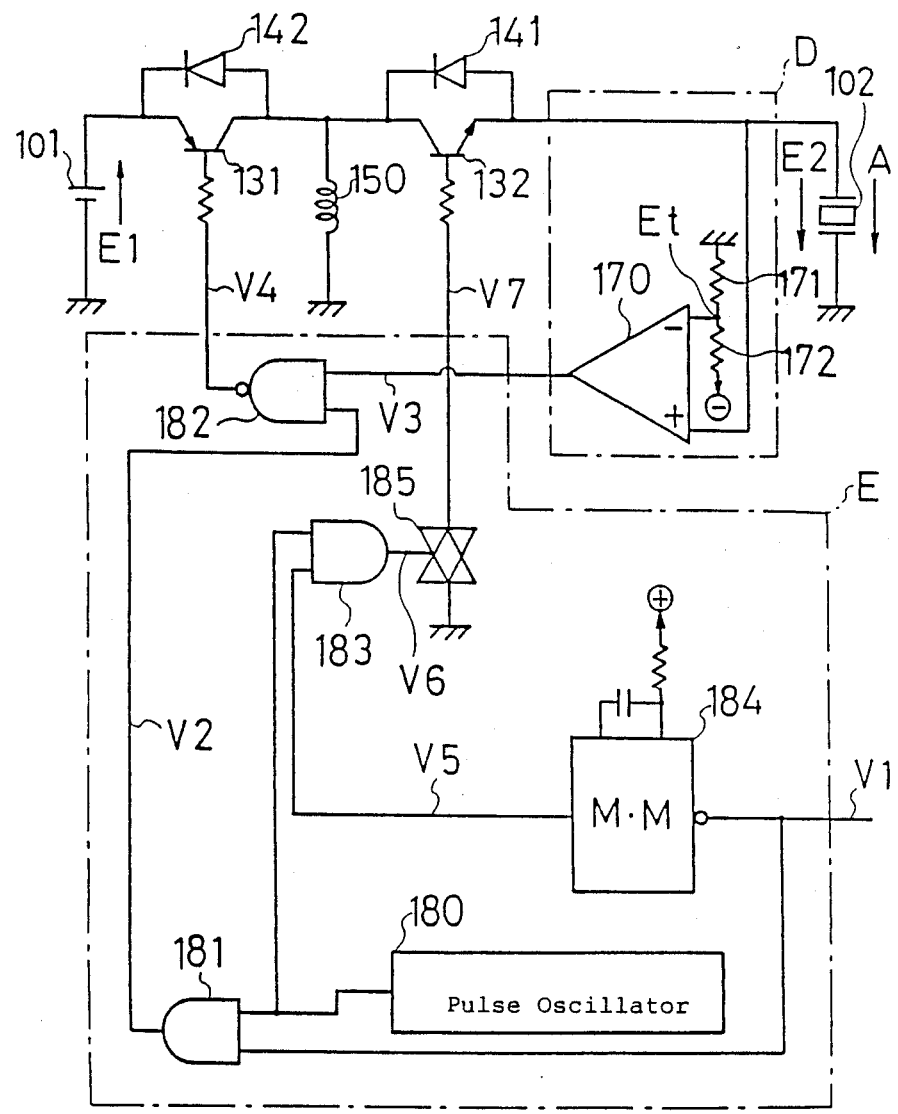
FIG. 8 is a circuit diagram of another embodiment of the invention.

FIG. 8 shows another piezoelectric element drive circuit embodying the invention. The circuit shown in FIG. 8, which provides a voltage rise or drop as well as bidirectional power transmission, consists of two DC/DC (Direct-Current to Direct-Current) converters with different transmitting directions connected in parallel by way of a coil shared by them, each of which is formed by a basic circuit of a one-way DC/DC converter providing a voltage rise or drop as illustrated in FIG. 12.

Figure 12:
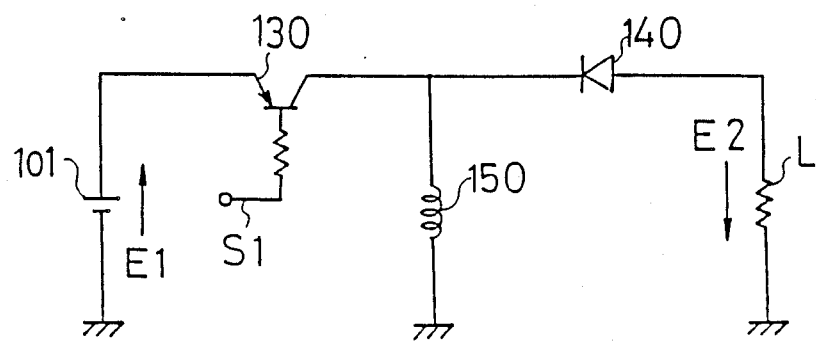
FIG. 12 is a circuit diagram of a converter which forms basic part of the drive circuit illustrated in FIG. 8.
Figure 13:
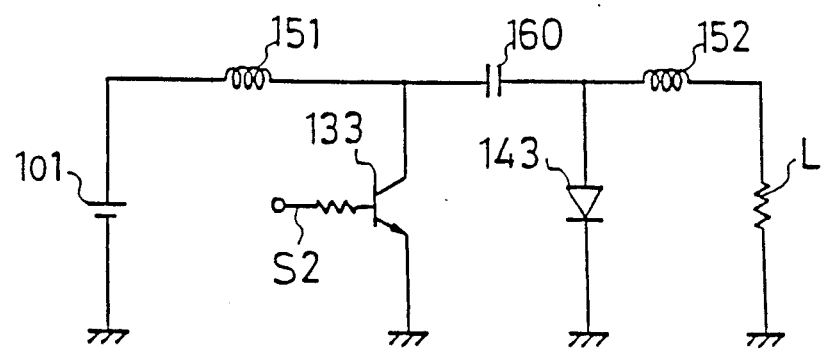
FIG. 13 is a circuit diagram of a converter which forms basic part of the drive circuit illustrated in FIG. 9.

The basic circuit shown in FIG. 12 consists of a direct-current power source 101, a transistor 130 serving as a switching element, a coil 150 and a diode 140. The transistor 130 is duty-controlled in response to a control signal S1. When the transistor 130 is on, the current from the power source 101 is passed through the coil 150 so that the power from the power source 101 is accumulated in the coil 150 as magnetic energy.

With the transistor 130 turned off, the energy accumulated in the coil 150 is passed through the load L and the diode 40. The on/off cycle thus repeated enables the load L to receive an averaged direct-current flowing therethrough. If the load L is of resistance, a certain load current flows through it so that the inter-terminal voltage of the load L is kept constant by controlling the transistor 130 at a certain constant duty ratio. If the load is a capacitive one, the voltage simply rises and cannot be controlled to a predetermined value because there is no current consumption. Further, energy loss is minimized by regenerating the charge existing in the piezoelectric element at the power source after the piezoelectric element is brought into its operating condition.

There is has formed a DC/DC converter providing a voltage rise or drop as well as bidirectional power transmission as shown in FIG. 8 which consists of two DC/DC converters connected in parallel, each of which is a one-way DC/DC converter providing a voltage rise or drop.

Indicated by numeral 102 is a piezoelectric element. A transistor 131, a coil 150 and a diode 141 form together a one-way, voltage rise or drop DC/DC converter which supplies the piezoelectric element 102 with power from a power source 101, while a transistor 132, the coil 150 and a diode 142 form together another one-way, voltage rise or drop DC/DC converter which regenerates the power from the piezoelectric element 102 at the power source 101. The transistor 131 serves as the first switching element which accomplishes switching operation to supply the piezoelectric element 102 with power from the power source 101 and the transistor 132 as the second switching element which accomplishes switching operation to regenerate the power accumulated in the piezoelectric element 102 at the power source 101. These two DC/DC converters are connected in parallel by way of the coil 150 shared by them. Since the polarity of input voltage E1 and output voltage E2 at one converter is reverse to that at the other converter, the diodes 141, 142 and the transistors 131, 132 are so connected respectively to allow the current flow in opposite directions.

A comparator 170 is provided as a voltage detection circuit D to detect a voltage E2 between the terminals of the piezoelectric element 102. A terminal voltage −E2 of the piezoelectric element 102 is applied to non-inversing input terminal of the comparator 170, while its inversing input terminal receives a reference voltage Et obtained by dividing the voltage with resistors 171 and 172. The output of the comparator 170 turns to a low level when the inter-terminal voltage E2 exceeds the absolute value of the reference voltage Et.

A converter control device E comprises a rectangular wave oscillator 180, an AND gate 181 receiving the output of a rectangular wave oscillator 180 and a drive signal V1, a NAND gate 182 receiving the output of the AND gate 181 and the output of the comparator 170, a mono-stable multi-vibrator 184 which receives the drive signal V1 and outputs a pulse signal of a certain pulse width, an AND gate 183 receiving the output of the mono-stable multi-vibrator 184 and the output of the oscillator 180, and an analog switch 185 which sends the output of the AND gate 183 to the control terminal. The output of &he NAND gate 182 is applied to the base of the transistor 131. One signal terminal of the analog switch 185 is grounded, while the other signal terminal is connected to the base of the transistor 132.

Figure 14:
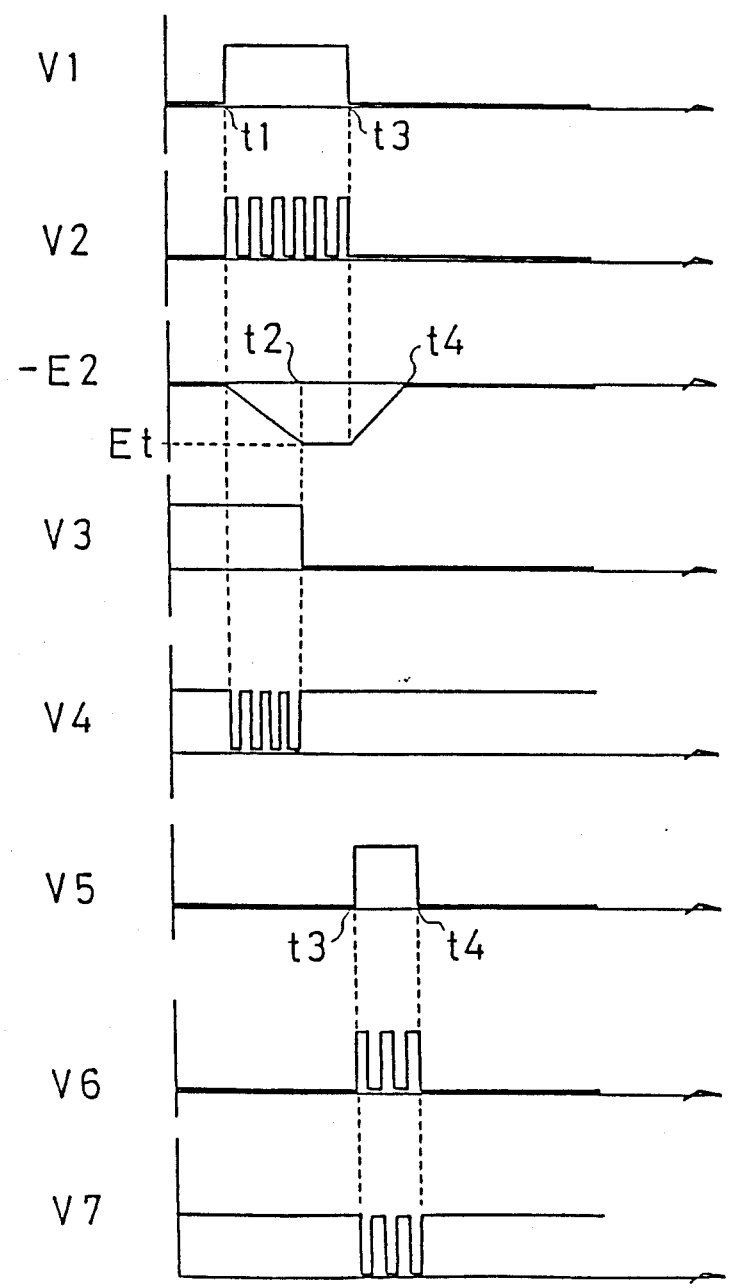
FIG. 14 is a timing chart for explanation of the operation of the drive circuit illustrated in FIG. 8.

The operation of the above constructed drive circuit is now described with reference to the timing chart shown in FIG. 14.

The drive signal V1 rises at time t1 and falls at time t3. The rise time of the drive signal represents the timing at which the piezoelectric element 102 is charged to drive a printer wire, not shown, while the fall time of the drive signal represents the timing at which the piezoelectric element 102 is discharged to regenerate the charge accumulated in the piezoelectric element 102 at the power source 101 to restore the original position of the wire. The output V2 of the AND gate 181 is made equal to the output of the rectangular wave oscillator 180 while the drive signal V1 is kept at a high level, while being kept at a low level for other period. Since the output V3 of the comparator 70 is kept high until the time t2 when the terminal voltage −E2 of the piezoelectric element 102 exceeds the reference voltage Et in the negative direction, the output V4 of the NAND gate 182 presents an inversed waveform of the output V2 of the AND gate 181 until the time t2. While the base voltage of the transistor 131 is therefore kept high until time t1 to keep the transistor 131 off, the base voltage of the transistor 131 oscillates from time t1 to t2 to repeat on and off of the transistor 131.

Then, as described above, the inter-terminal voltage E2 of the piezoelectric element 102 gradually grows because of the circuit consisting of the coil 150, the piezoelectric element 102 and the diode 141, while the terminal voltage −E2 drops toward the reference voltage Et. Passing the time t2 when the terminal voltage −E2 exceeds the reference voltage t2, the base voltage of the transistor 131 is turned to high level to turn off the transistor 131. At this time, the inter-terminal voltage E2 of the piezoelectric element 102 is kept at |Et|.

At time t3, the mono-stable multi-vibrator 184 is triggered due to the fall of the drive signal V1 so that its output V5 forms a pulse with a certain width which is thus kept high from time t3 to t4. Consequently, the output V6 of the AND gate 183 takes the same waveform as the output of the rectangular wave oscillator 180 for the period from t3 to t4. The analog switch 195 is thus turned on and off during this period whereby the base voltage of the transistor 132 oscillates to a ground potential to turn on and off the transistor 132. The charge accumulated in the piezoelectric element 102 in A direction is then turned to an oscillating current in the circuit consisting of the coil 150 and the transistor 132. The oscillating current is passed through the coil 150 and the diode 142 and regenerated at the power source 101 due to the counter-electromotive force generated in said coil 150. The period from t3 to t4 is approximately set to the period for which the inter-terminal voltage E2 of the piezoelectric element 102 turns to zero volt. The analog switch 185 is therefore turned off at time 3 to open the base of the transistor 132 thereby turning off the transistor 132. One cycle of driving the piezoelectric element 102 is completed in this manner.

With such control procedures, the transistor 131 is turned off when the inter-terminal voltage E2 of the piezoelectric element 102 reaches a predetermined value to complete displacement of the piezoelectric element 102, thereby suppressing a switching loss at the transistor 131. The voltage detection circuit D and the converter control device E in FIG. 8 is for the sake of example only and should not be limited to the configuration and arrangement illustrated.

Figure 9:
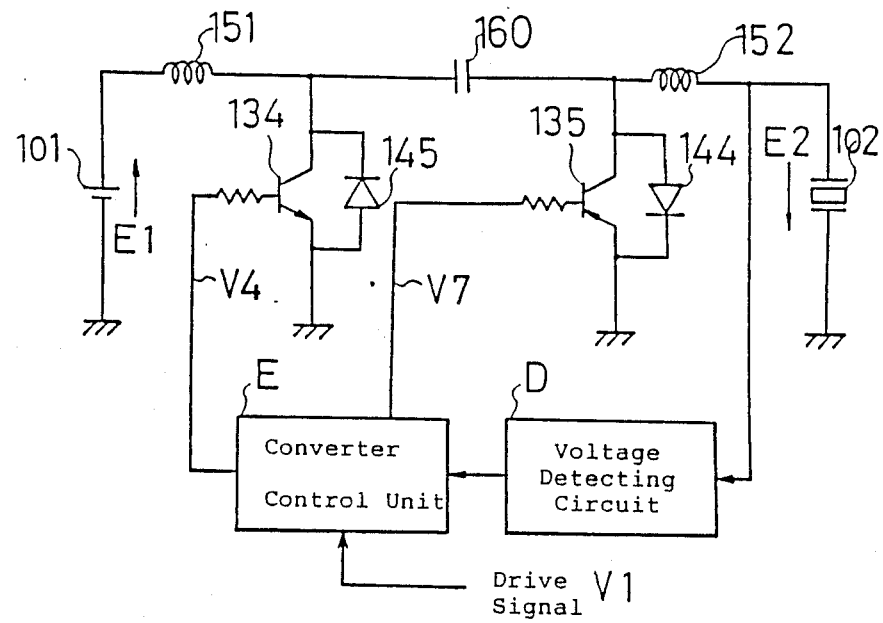
FIG. 9 is a circuit diagram of a modified embodiment of the invention.

FIG. 9 is a circuit diagram showing modified arrangement of the DC/DC converter providing a voltage rise or drop as well as bidirectional power transmitting. The DC/DC converter shown in FIG. 9 consists of two DC/DC converters with different transmitting directions connected in parallel by way of coils and a capacitor shared by them, each of which is formed by a basic circuit of a one-way, voltage rise or drop DC/DC converter as illustrated in FIG. 6.

The basic circuit shown in FIG. 6 consists of the direct-current power source 101, a transistor 133 serving as a switching element, coils 151, 152, a capacitor 160 and a diode 143. The transistor 133 is duty-controlled in response to a control signal S2. When the transistor 133 is on, the current from the power source 101 is passed through the coil 151 so that the power from the power source 101 is accumulated in the coil 151 as magnetic energy.

With the transistor 133 turned off, the current is passed through the coil 161, the capacitor 160 and the diode 143 and the energy accumulated in the coil 151 is stored in the capacitor 160 as static energy. When the transistor 133 is turned on again, the charge accumulated in the capacitor 160 is passed through a closed circuit consisting of the transistor 133, the load L, the coil 152 and the capacitor 160 to supply the load L with the current. The on/off cycles thus repeated enables the load L to receive an averaged direct-current flowing therethrough. If the load L is of resistance, a certain load current flows through it so that the inter-terminal voltage of the load is kept constant by controlling the transistor 130 at a certain constant duty ratio. If the load is a capacitive one, the voltage simply rises and cannot be controlled to a predetermined value because there is no current consumption. Further, energy loss is minimized by regenerating the charge stored in the piezoelectric element at the power source after the piezoelectric element is brought into its operating condition.

There is thus formed a DC/DC converter providing a voltage drop or rise as well as a bidirectional power transmission as shown in FIG. 9 which consists of two DC/DC converters connected in parallel, each of which is a one-way, voltage rise or drop DC/DC converter.

The transistor 134, coils 151, 152, the capacitor 160 and the diode 144 form together a one-way, voltage rise or drop DC/DC converter which supplies the piezoelectric element 102 with the charges from the power source 101, while the transistor 135, coils 151, 152, the capacitor 160 and the diode 145 form together another one-way, voltage rise or drop DC/DC converter which regenerates the power from the piezoelectric element 102 at the power source 101. The transistor 134 serves as the first switching element which accomplishes switching operation to supply the piezoelectric element 102 with power from the power source 101 and the transistor 135 as the second switching element which accomplishes switching operation to regenerate the power accumulated in the piezoelectric element 102 at the power source 101. These two DC/DC converters are connected in parallel by way of the coils 151, 152 and the capacitor 160 shared by them. Since the polarity of input voltage E1 and output voltage E2 at one converter is reverse to that at the other converter, the diodes 144, 145 and the transistors 134, 135 are so connected respectively to allow the current flow in opposite directions.

Furthermore, there is provided the voltage detection circuit D for detecting the inter-terminal voltage E2 of the piezoelectric element 102 and the converter control device E for controlling on and off operation of the transistors 134 and 135 by applying a drive signal V1. The voltage detecting circuit D and the converter control device E provide nearly the same configuration and operation as in the circuit shown in FIG. 1.

More specifically, when the transistor 134 only is turned on and off in synchronism with the rise of the drive signal V1, with the transistor 135 kept off, the voltage E1 at the power source 101 rises to be applied to the piezoelectric element 102 by virtue of the circuit consisting of the coil 151, the transistor 134, the capacitor 160, the diode 144 and the coil 152. When the interterminal voltage E2 exceeds the absolute value of the reference voltage Et, the transistor 134 is turned off to charge the piezoelectric element 102 to the reference voltage Et. When the transistor 135 is now turned on and off in synchronism with the rise of the drive signal V1, with the transistor 134 kept off, the charge existing in the piezoelectric element 102 is regenerated at the power source 101 by virtue of the circuit consisting of the coil 152, the transistor 135, the capacitor 160, the diode 145 and the coil 151. When the inter-terminal voltage E2 approximately reaches zero volt, the transistor 135 is turned off to regenerate the charge existing in the piezoelectric element 102 at the power source 101.

Figure 10:
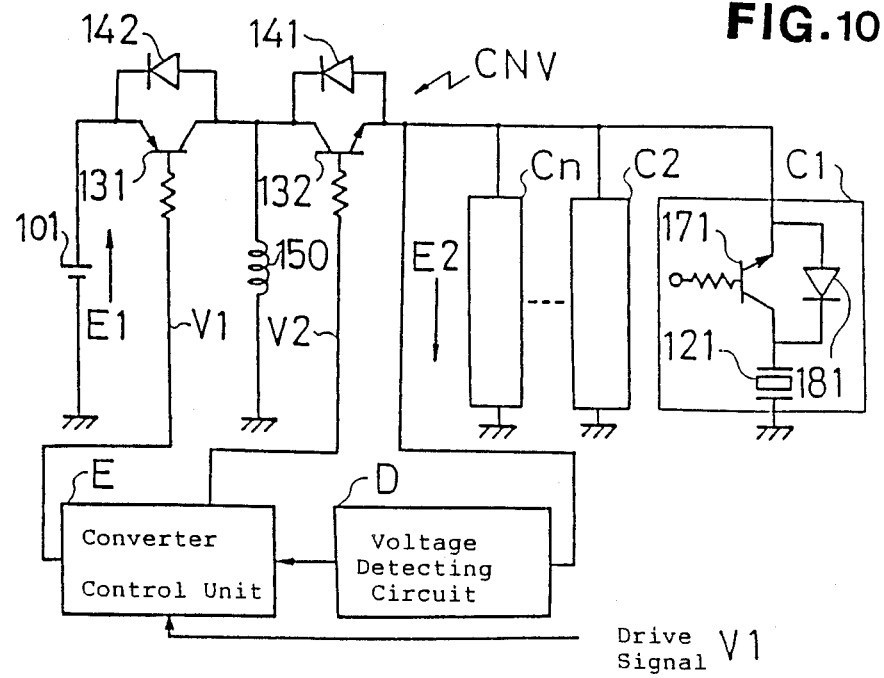
FIGS. 10 and 11 are circuit diagrams of piezoelectric element drive circuit for selectively driving multiple piezoelectric elements.
Figure 11:
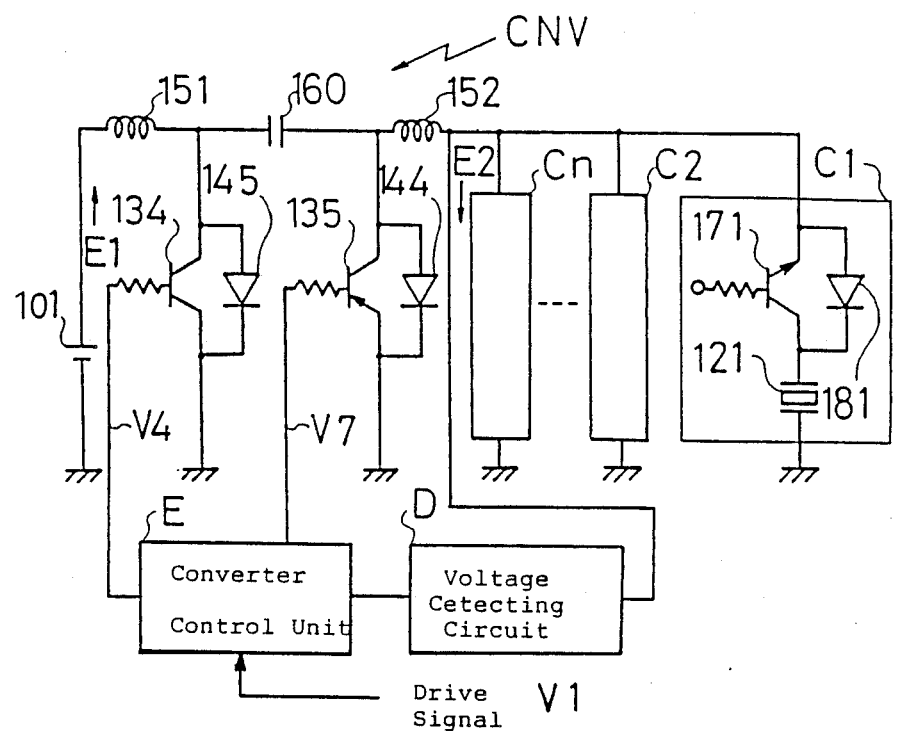

FIGS. 10 and 11 show drive circuits each installed in a matrix printer. The DC/DC converter is shared by multiple piezoelectric elements 121 for driving the corresponding printing wires, not shown. The piezoelectric element 121 in the circuit C1 is connected to the DC/DC converter CNV via a parallel circuit consisting of a transistor 171 and a diode 181. Multiple circuits of the same configuration as the circuit C1 consisting of the piezoelectric element 121, the transistor 171 and the diode 181 are provided in number corresponding to the wires. The transistor 171 serves to select any piezoelectric element to be driven by turning on when driving the wire connected thereto. The diode 181 is provided to bypass the transistor 171 when the charge existing in the piezoelectric element 121 is regenerated at the power source 101 after wire impact is completed. The DC/DC converter CNV turns on and off the transistor 131 or 134 in synchronism with the rise of the drive signal V1 until the output voltage reaches the predetermined reference voltage. After this, it turns on and off the transistor 132 or 135 only in synchronism with the fall of the drive signal V1 until the inter-terminal voltage E2 of the piezoelectric element 121 approximately drops to zero volt. While the selected piezoelectric element 121 is thus charged one by one, the charge within all the piezoelectric elements 121 can be regenerated at the power source 101 at one time.

The above described embodiments employ the DC/DC converter which provides the voltage rise or drop as well as bidirectional power transmission to drive the piezoelectric element so that the charge accumulated in the piezoelectric element during driving can be regenerated at the power source to improve the power efficiency in the drive circuit. During driving, only the first switching element of the bidirectional DC/DC converter is turned on and off to supply the piezoelectric element with the power from the direct-current power source until the inter-terminal voltage of the piezoelectric element reaches the predetermined value, while its switching operation is ceased when the inter-terminal voltage reaches the predetermined value thereby suppressing switching loss during driving.

I claim:

1. A drive circuit for a piezoelectric element comprising:
   a first external signal source;
   a charge circuit including a direct-current power source, a switching means, and a piezoelectric element connected in series for charging the piezoelectric element in response to a signal from said first external signal source so as to operate said piezoelectric element and to produce a first polarity in said piezoelectric element with a high potential side and a low potential side;
   an inductor, one end of which is connected at the connecting point of said switching element and said piezoelectric element, forming a resonant circuit with said piezoelectric element;
   a switching circuit connected between the other end of said inductor and the connecting point of said direct-current power source and said piezoelectric element;
   a second external signal source connected to sdaid switching circuit, sdaid switching circuit allowing a current flow in only one direction selected in response to a signal from said second external signal source so as to transfer the charge supplied by said drive circuit and stored in said piezoelectric element so that said piezoelectric element is charged to an opposite polarity to said first polarity; and,
   a third external signal source connected to said switching circuit, said switching circuit allowing a current flow only in a direction opposite to said one direction in response to a signal from said third external signal source so as to reversely transfer the charge on said piezoelectric element so that said piezoelectric element is again operated and charged in said first polarity.

2. The drive circuit according to claim 1 wherein said charge circuit charges said piezoelectric element when said piezoelectric element is in its non-operating polarity.

3. The drive circuit according to claim 1 wherein said switching circuit comprises a pair of parallel-connected thyristors, the allowed direction of the current flow through which is opposite each other.

4. The drive circuit according to claim 1 wherein said charge circuit is connected, in parallel with said switching circuit, between one terminal of said piezoelectric element and one end of said inductors.

5. The drive circuit according to claim 1 which further comprises a diode and a transistor, both being parallel-connected between said piezoelectric element and said switching circuit so that said switching circuit can be operated without changing the polarity of said piezoelectric element when said transistor is turned off.

6. The drive circuit according to claim 1 wherein said switching circuit comprises a pair of thyristors, the allowed direction of the current flow through which is opposite each other, each of said thyristors being connected in parallel between the terminals of said piezoelectric element, and wherein a pair of inductors, each connected between one of said thyristors and one of said terminals of the piezoelectric element.

7. A piezoelectric element drive circuit comprising:
a direct-current power source;
a power transmitting means interconnected between said power source and said piezoelectric element for bi-directionally transmitting a power therebetween; and
control means for controlling the power accumulated in said piezoelectric element at said power source;
wherein said power transmitting means includes:
an inductor;
a first switching element connected between said power source an said inductor to form a first circuit;
a first rectifier element arranged in parallel with said first switching element to allow a current flow in the direction opposed to that allowed in said first switching element;
a second switching element connected between said inductor and said piezoelectric element to form a second circuit; and
a second rectifier element arranged in parallel with said second switching element to allow a current flow in the direction opposed to that allowed in said second switching element, and
wherein said control means controls said first switching element to be turned onto charge said inductor with the power of said power source via said first switching element and to be turned off to charge said piezoelectric element with the power accumulated in said inductor via said second rectifier element while said second switching element is controlled by said control means to be turned on and off to regenerate the power accumulated in said piezoelectric element at said power source via said second circuit and said first rectifier element.

8. The drive circuit according to claim 7 which further comprises a diode and a transistor, both being parallel-connected between said piezoelectric element and said power transmitting means so that said power transmitting means can be operated without changing the polarity of said piezoelectric element when said transistor is turned off.

9. The drive circuit according to claim 7 which further comprises a voltage detection means for detecting a voltage between both terminals of said piezoelectric element, and wherein said first switching element is controlled to be turned on and off by said control means until said voltage between the terminals detected by said voltage detecting means reaches a predetermined value.

10. The circuit according to claim 7 wherein said first and second switching elements are normally maintained to be turned of, and wherein said control means comprises:
means for generating pulse signals;
first means for transmitting said pulse signals to said first switching element to turn it on and off for a period determined by an external signal: and
second means for transmitting said pulse signals to said second switching element for a predetermined period upon the termination of transmission of said pulse signals to said first switching means.

11. A piezoelectric element drive circuit which comprises:
a direct-current power source;
power transmitting means interconnected between said power source and said piezoelectric element for bi-directionally transmitting a power therebetween; and
control means for controlling said power transmitting means so as to charge said piezoelectric element or to regenerate the power accumulated in said piezoelectric element at said power source;
wherein said power transmitting means comprises:
a first inductor;
a first switching element connected between said power source and said first inductor to form a first circuit; ·
a first rectifier element arranged in parallel with said first switching element to allow a current flow in the direction opposed to that allowed in said first switching element;
a second inductor;
a second switching element connected between said second inductor and said piezoelectric element to form a second circuit;
as second rectifier element arranged in parallel with said second switching element to allow a current flow in the direction opposed to that allowed in said second switching element; and
a capacitor connected between a connecting point of said first inductor and said first switching element and connecting point of said second inductor and said second switching element; and
wherein said control means controls said first switching means to be turned on to charge said first inductor with the power of said power source via said first switching element and to be turned off to charge said piezoelectric element with the power accumulated in said inductor via said second rectifier element while said second switching element is controlled by said control means to be turned on and off to regenerate the power accumulated in said piezoelectric element in said power source via said second circuit, said capacitor and sdaid first rectifier element.

12. The drive circuit according to claim 11 which further comprises a voltage detection means for detecting a voltage between both terminals of said piezoelectric element, and wherein said first switching element is controlled to be turned on and off by said control means until said voltage between the terminals detected by said voltage detecting means reaches a predetermined value 13. The drive circuit according to claim 11 wherein said first and second switching elements are normally maintained to be turned off, and wherein said control means comprises:

means for generating pulse signals;

first means for transmitting said pulse signals to said first switching element to turn it on and off for a period determined by an external signal: and second means for transmitting said pulse signals to said second switching element for a predetermined period upon the termination of transmission of said pulse signals to said first switching means.

* * * * *